United States Patent
Hofsäss et al.

[11] Patent Number: 5,329,238
[45] Date of Patent: Jul. 12, 1994

[54] ARRANGEMENT FOR FAULT MONITORING AN ELECTRIC CONSUMER IN A MOTOR VEHICLE TO DETECT SHORT CIRCUITS AND INTERRUPTIONS IN THE REGION OF THE CONSUMER

[75] Inventors: Michael Hofsäss, Vaihingen/Enz; Martin Rutz, Schwieberdingen; Harald Schweren, Korntal-Münchingen, all of Fed. Rep. of Germany

[73] Assignee: Robert Bosch GmbH, Stuttgart

[21] Appl. No.: 922,750

[22] Filed: Jul. 31, 1992

[30] Foreign Application Priority Data

Jul. 31, 1991 [DE] Fed. Rep. of Germany ....... 4125302

[51] Int. Cl.⁵ ............................................. G01R 31/08
[52] U.S. Cl. .................................... 324/522; 324/503; 324/521; 324/523; 324/709
[58] Field of Search ............... 324/503, 522, 523, 527, 324/537, 555, 709, 521

[56] References Cited

U.S. PATENT DOCUMENTS

4,951,188  8/1990  Peter et al. .
5,142,235  8/1992  Matsumoto et al. ................ 324/537

Primary Examiner—Kenneth A. Wieder
Assistant Examiner—Glenn W. Brown
Attorney, Agent, or Firm—Walter Ottesen

[57] ABSTRACT

The invention is directed to an arrangement for monitoring an electric consumer in a motor vehicle. The consumer can be actuated by at least one pulse-shaped control signal formed by a control unit with this actuation taking place via a switching device. This arrangement includes a device for detecting electric variables in the region of the consumer and a device for comparing these variables to pregiven limit values as well as a device for recognizing a fault on the basis of this comparison. The device for recognizing faults evaluates the comparison result for recognizing a fault condition pursuant to the actuating state of the electric consumer.

10 Claims, 4 Drawing Sheets

ARRANGEMENT FOR FAULT MONITORING AN ELECTRIC CONSUMER IN A MOTOR VEHICLE TO DETECT SHORT CIRCUITS AND INTERRUPTIONS IN THE REGION OF THE CONSUMER

BACKGROUND OF THE INVENTION

An arrangement of the kind recited in the title of the invention is disclosed in U.S. Pat. No. 4,951,188. In this patent, an electric consumer, which can be switched off in a two-pole manner, is monitored on the basis of electric variables which are detected in the region of the drive element. The consumer can, for example, be an electric motor which is actuated by at least one pulse-shaped control signal via at least one drive element. Means for recognizing faults such as short circuits in the area of the consumer or of the drive element actuating the consumer are detected by a comparison to limit values.

A disadvantage of this known arrangement is the very substantial complexity with respect to electronic components.

SUMMARY OF THE INVENTION

It is an object of the invention to reduce the complexity of monitoring an electric consumer and the drive elements controlling the same.

This is achieved in that means are provided for detecting electric variables in the region of the consumer and to compare these variables to limit values and means are provided for recognizing faults on the basis of the comparison results in accordance with the state of actuation of the consumer.

The measures provided by the invention permit a considerable reduction of the complexity for monitoring an electric consumer and the drive elements thereof in a motor vehicle.

Special advantages are provided for a consumer driven by a bridge circuit, preferably, an electric motor for controlling a throttle flap or an injection pump.

It is especially advantageous that the monitoring and evaluation of the detected variables can be carried out by means of a computer element. In this connection, only two measuring resistors are needed at the terminals of the consumer for detecting the variables.

The procedure provided by the invention guarantees the detection of short circuits and interruptions in the region of the consumer and the drive elements thereof in all operating states. The types of faults can be distinguished on the basis of the fault evaluation. In this way, the operational safety of the motor vehicle is ensured.

The monitoring can be carried out even when the supply voltages deviate from the normal condition by considering the supply voltage during monitoring.

BRIEF DESCRIPTION OF THE DRAWINGS

The invention will now be described with reference to the drawings wherein.

DESCRIPTION OF THE PREFERRED EMBODIMENTS OF THE INVENTION

Figure 1A:
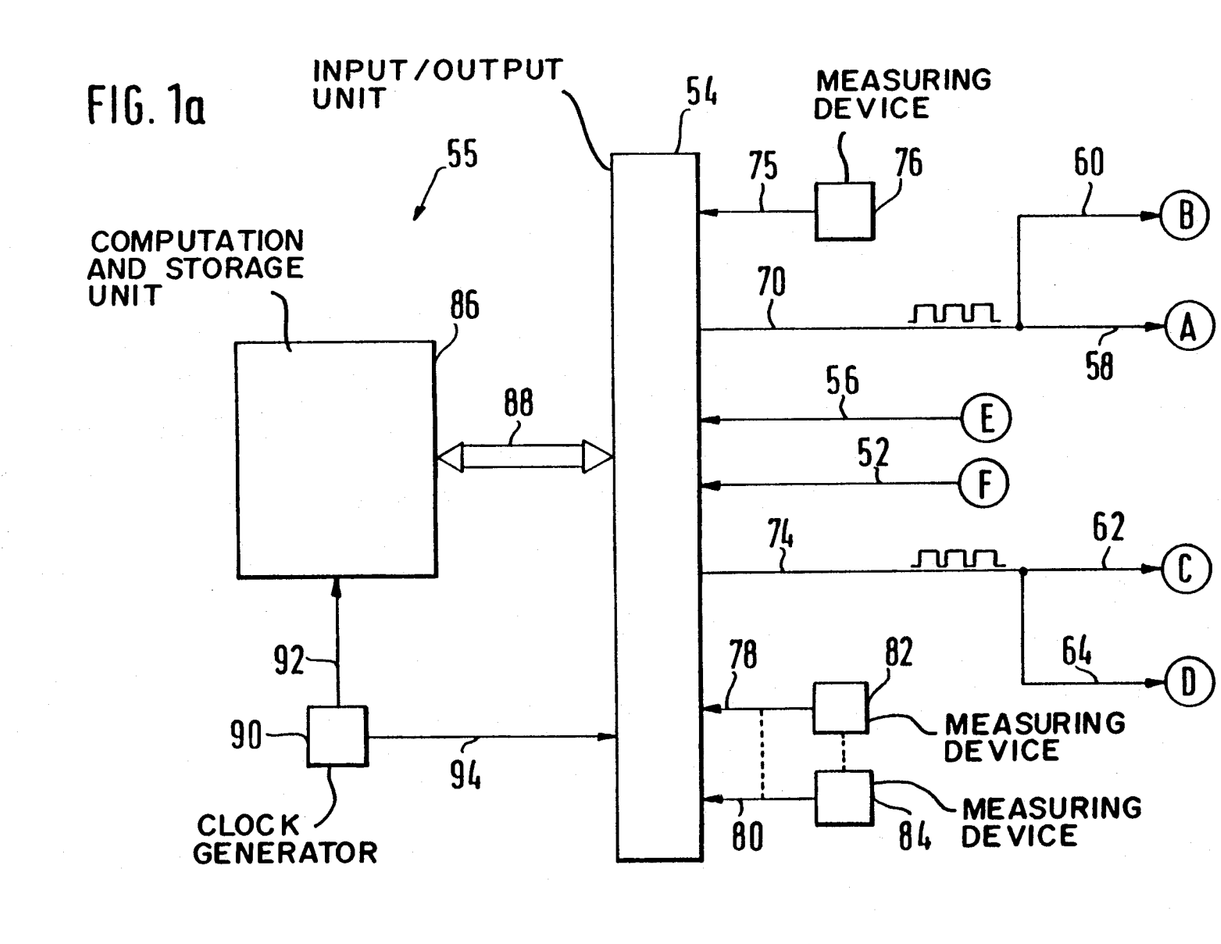
FIG. 1a shows a block circuit diagram of an open-loop control system for an electric consumer having monitoring means for this consumer.
Figure 1B:
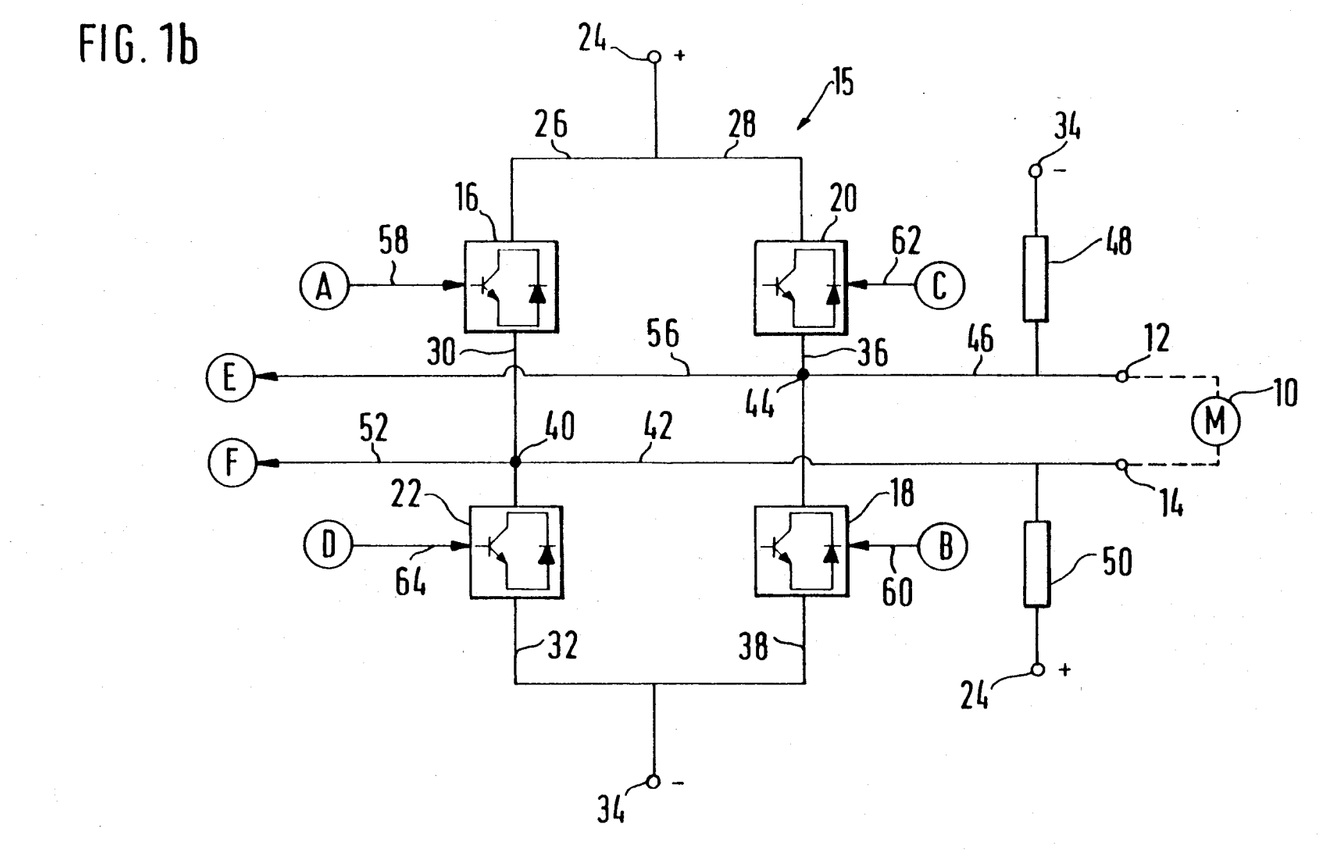
FIG. 1b is a circuit diagram showing an electric consumer and a bridge circuit for driving the consumer.

FIG. 1b shows an electric consumer 10 having two terminal points 12 and 14. The electric consumer 10 is preferably an electric motor controlling a movable element in a motor vehicle such as a throttle flap or an injection pump.

The actuation or driving of the electric consumer 10 takes place by means of a bridge circuit 15. This bridge circuit includes four drive and switching elements 16, 18, 20 and 22. Lines 26 and 28 lead to switching elements 16 and 20, respectively, from the positive pole 24 (U+) of the supply voltage. A connecting line 30 interconnects the switching elements 16 and 22. A connecting line 32 leads to the negative pole 34 (U−) of the supply voltage from the switching element 22. In the same manner, a connecting line 36 is provided which connects the switching elements 20 and 18 to each other. The switching element 18 is connected via a connecting line 38 to the negative pole 34 of the supply voltage.

A circuit node 40 is provided on the connecting line 30. A connecting line 42 is connected to the circuit node 40 and connects the circuit node 40 to the terminal point 14 of the electric consumer 10. In the same manner, a circuit node 44 is provided on the connecting line 36 to which a connecting line 46 is connected. The connecting line 46 connects the circuit node 44 to the terminal point 12 of the electric consumer 10.

A resistor 48 is connected between the connecting line 46 and the negative pole 34 of the supply voltage while a second resistor 50 is connected between the connecting line 42 and the positive pole 24 of the supply voltage.

The connecting line 42 is continued from circuit node 40 with a connecting line 52 to an input/output unit 54 of a control unit 55 shown in FIG. 1a. In the same manner, the connecting line 46 is extended with a connecting line 56 to the input/output unit 54 of the control unit 55 as shown in FIG. 1a.

The switching elements 16, 18, 20 and 22 are preferably switchable power transistors which are commercially available. These transistors satisfy the requirements delineated below and are actuated by a pulse-shaped clocked drive signal. The use of MOS-FET transistors is especially advantageous. The common drive signal for the switching elements 16 and 18 for a first operating mode of the consumer 10 is supplied to the switching elements 16 and 18 via the connecting lines 58 and 60, respectively. The switching elements 20 and 22 for the second operating mode of the consumer 10 are supplied with a drive signal via the connecting lines 62 and 64, respectively. The lines 58 and 60 conjointly define the output line 70 of the input/output unit 54 (see FIG. 1a). In the same manner, the connecting lines 62 add 64 define the output line 74 of the input/output unit 54.

In addition, the input/output unit 54 is supplied with operating variables of the motor vehicle and/or the drive unit thereof from corresponding measuring devices 82 to 84, respectively. The input/output unit 54 is also supplied with a value representing the supply voltage from a measuring device 76 via the input line 75.

In addition to the input/output unit 54, the control unit 55 includes a computation and storage unit 86 which is connected via a bus system 88 to the input/output unit 54. In addition, a clock generator 90 is provided which transmits clock signals to the computation and storage unit 86 via line 92 add to the input/output unit 54 via line 94.

Il the foregoing, an electric consumer was shown driven by means of a full-bridge circuit. The procedure provided by the invention is however possible also for half-bridge circuits wherein, for example, the switching elements 16 and 20 are not included. Furthermore, the monitoring of the electric consumer in accordance with the invention is also suitable in combination with individual drive circuits.

The computation and storage unit 86 forms a drive signal for the electric consumer 10 in dependence upon the operating variables supplied from the measuring devices 82 to 84 via the lines 78 to 80, respectively. The operating variables can be the engine temperature, wheel rotational speed, engine rotational speed, road speed, accelerator-pedal position, throttle-flap position, etcetera.

The consumer 10 is an electric motor in the embodiment of the invention described below.

If the system shown in FIGS. 1a and 1b is an electronic accelerator pedal for controlling the power of the engine of the motor vehicle, then the computation and storage unit 86 forms the drive signal in such a manner that the power-determining element (connected to the electric motor 10) of the motor vehicle is moved in the sense of a control of the power in accordance with the driver's command detected via the position of an operator-actuated element.

In the case of a drive-slip control system, the computation and storage unit 86 forms a drive signal independently of the driver's command for the power-determining element of the vehicle engine in such a manner that a slip of the drive wheels does not exceed a pregiven value. The slip of the drive wheels is detected via the measuring devices 82 to 84.

The drive signal formed in the dependence upon the operating variables is transmitted by the computation and storage unit 86 to the input/output unit 54 via the bus system 88. The input/output unit 54 then undertakes all tasks which are necessary for converting the signal generated by the computation and storage unit into a drive signal for the switching elements 16 to 22. These tasks can include, for example, the digital-to-analog conversion, signal-level adaptation, signal forming, etcetera. Furthermore, the input/output unit 54 includes means for the analog-to-digital conversion and signal preparation of the input signals of the control unit 55.

The input/output unit 54 supplies a drive signal to the switching element 16 to 22 in dependence upon the mode of operation, that is, in dependence upon the direction of rotation of the motor 10. The drive signal is supplied to the switching elements 16 and 18 via line 70 for the first rotational direction and to switching elements 20 and 22 via the line 74 for the second rotational direction. In this way, and in dependence upon direction of rotation, a pulse-shaped drive signal is transmitted to the corresponding switching elements via lines (58, 60) and (62, 64) respectively. In this way, the switching elements 16 and 18 are closed simultaneously for the one direction of movement of the motor 10 so that a current flow is provided from the positive pole 24 of the supply voltage via the terminal points 14 and 12 of the electric consumer 10 to the negative pole 34 of the supply voltage. If the second direction of movement of the motor 10 is selected, then a drive signal is transmitted via the line 62 to the element 20 and via line 64 to the element 22. The elements then provide a current flow from the positive pole 24 of the supply voltage via the terminal 12 of the motor 10, the terminal 14 of the motor 10 and the switching element 22 to the negative pole 34 of the supply voltage.

The drive takes place in a clocked manner with a pulse length pregiven by the computation and storage unit so that a non-driving phase (the so-called free running F) takes place in response to a drive of the consumer 10 adjusted in correspondence to the operating variables. The motor 10 then generates an inductive voltage.

All four switching elements are opened when no drive signal is applied. The potentials at the terminal points 12 and 14 of the electric consumer 10 are detected via the connecting lines 52 and 56 with the aid of the resistors 48 and 50 and are evaluated by the computation and storage unit 86 for fault monitoring. The two resistors then preferably have the same resistance value; however, this is not absolutely necessary. In order to minimize the current flow through the consumer during a non-drive condition, it is advantageous to select large resistance values without affecting the precision of the measurement.

Figure 2:
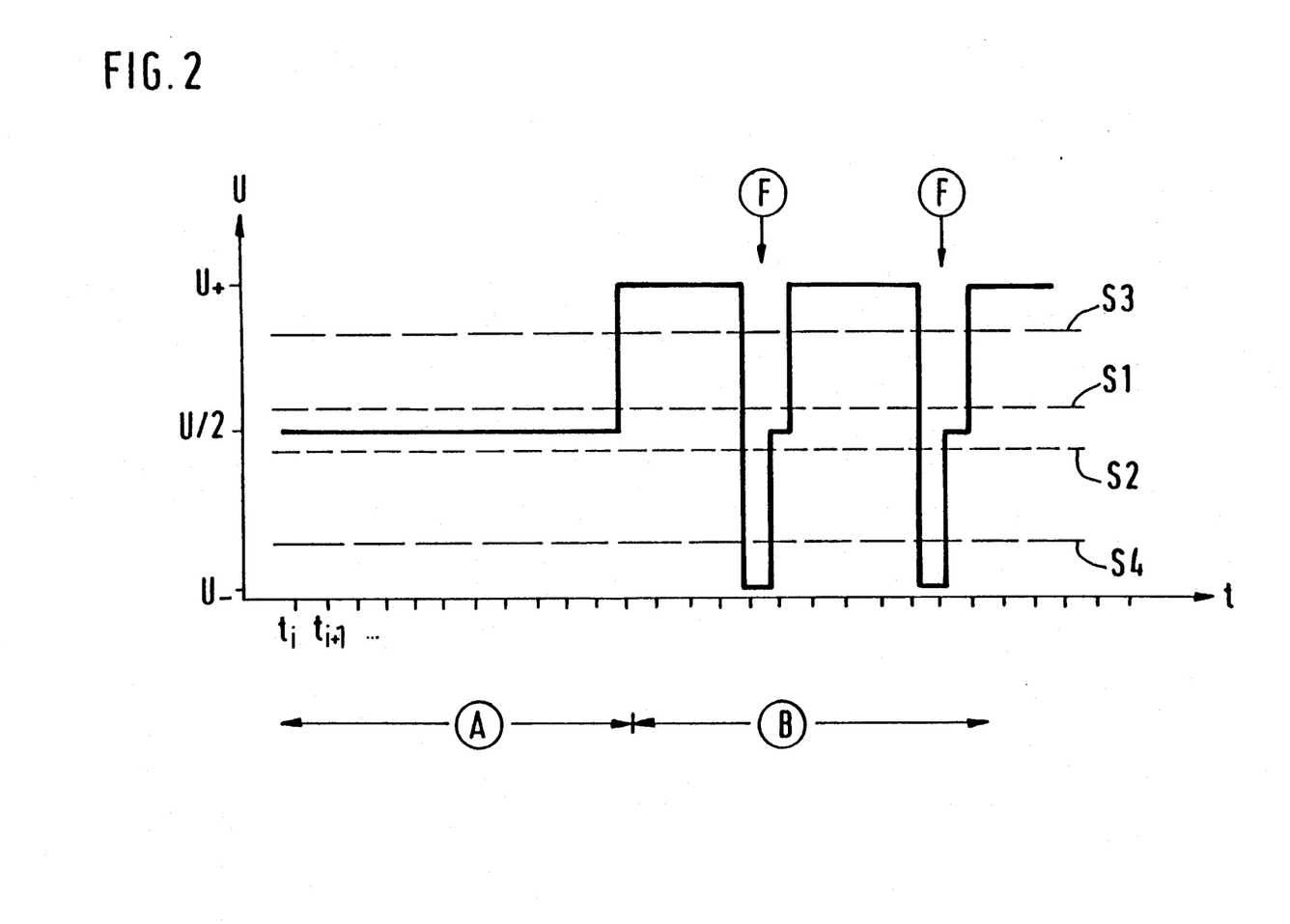
FIG. 2 shows a waveform for explaining the monitoring principle utilized by the arrangement of the invention; and, FIG. 3 is a flowchart which shows a possibility for realizing the monitoring as a program in a computer element.

FIG. 2 shows a typical signal trace at one of the terminal points of the electric consumer 10 while using the resistors 48 and 50 identified in FIG. 1b. The signal trace shown in FIG. 2 is the signal trace at the terminal point 12 in the context of the operating mode in which the switching elements 20 and 22 are closed. The corresponding signal trace at the terminal point 14 shows an inverse response. In the case of the other rotational direction, when the switching elements 16 and 18 are closed, a signal trace can be detected at the terminal point 14 corresponding to the signal trace shown in FIG. 2; whereas, at terminal point 12, the signal trace is inverse compared thereto.

In FIG. 2, the voltage value appears on the vertical axis which is read-in via the lines 56 or 52 and which has a maximum value (U+) and a minimal value (U−) corresponding to the supply voltages. The time is plotted along the horizontal axis where $t_i$, $t_{i+1}$, etcetera, are scanning time points at which a measurement of the potentials at the terminal points 12 and 14 of the electric consumer is undertaken.

FIG. 2 shows a first phase A of the non-driven condition of the motor 10 and a second phase B of the driven condition of the electric consumer 10. The first phase of the non-driven condition is characterized by a signal level $U_A$ ($U_2$) for a motor at rest. This signal level adjusts in the case of the non-driven condition when all switching elements 16 to 22 are opened as a consequence of the voltage divider of the resistors 48 and 50.

In the case of the phase B, the driven condition, the signal trace shows the following primary characteristics. If the switching elements 20 and 22 are closed, a voltage level lying in the range of the maximum voltage is present at the terminal point 12 of the electric consumer 10. After opening the switching elements 20 and 22, the motor 10 is in the electric free-running state and generates an induction voltage which leads the potential at the terminal point of the motor into the range of the minimum voltage. At the end of the free-running phase, a mean signal level $U_1$ adjusts as in the case of the non-driven condition (phase A).

It is noted that the potential trace shown is only exemplary. In dependence upon the manner of switchoff (switchoff by means of switching elements in the (+)-branch (16, 20) and/or in the (−)-branch (18, 22)), a different response is provided.

Similar relationships result, as described above, at terminal point 14 and for the other mode of operation.

For reasons of safety, the electric consumer is monitored with respect to the following: short circuits to the positive and negative poles of the supply voltage, short circuits of the two motor drive lines with respect to each other; and, interruptions in the motor loop. To reduce complexity, monitoring is not performed by means of switching elements but instead with the above-mentioned signal trace by the computation and storage element 86. Here, it should be considered that it has been shown that switching elements 16 to 22 exist which remain fully operational even when they are subjected to short circuits in the range of the scanning time (for example, 2 to 3 ms) across limiting cable harness resistances. In this way, monitoring can be performed by means of the computation/storage element 86.

In the non-driven phase A, a mean voltage level at the terminals 12 and 14 is adjusted by means of the voltage dividers in the case of almost equal resistance values. This can then be detected by the computation and storage unit 86. A maximal signal swing range for the measuring signals is an advantage of the equal resistance measurement. If short circuits or interruptions occur in the non-driven state, then the mean voltage level is displaced in the direction of the maximum or minimum voltage level. By determining limit values S1 and S2, short circuits and interruptions in the non-driven phase can be detected by evaluating the detected voltage level in that this voltage level exceeds the pre-given limit values. The limit values are then dependent upon the supply voltage; that is, these limit values are fixed in dependence upon the supply voltage present.

In the driven phase B with the switching elements closed, a fault in the area of the electric consumer can be detected by evaluating the measured signal level in combination with the limit values S3 and S4. The limit values S1 and S3 or S2 and S4 are identical in a simple embodiment. As shown in FIG. 2, this phase is characterized by a specific voltage level and, in the case of the terminal point 12 for the above-mentioned mode of operation of the motor, the voltage level is U+. The voltage level of the terminal points is shifted with short circuits and interruptions in the area of the motor 10 with this shift being such that it falls below the pregiven limit value. Here, it should be noted that in addition to the dependency of the limit values on the supply voltage, a dependency of the limit values on the direction of rotation of the motor also occurs. The comparison of the potential at the terminal point must be based on another limit value (S3 or S4) depending upon the terminal point and direction of rotation.

After switchoff, implausible potentials can occur in dependence upon realized electric free-running (switchoff by means of switching elements in the (+)-branch and/or (−)-branch). For this reason, and for the free-running phase which lasts only a few milliseconds, the monitoring of the terminal point potentials of the motor is interrupted. However, this does not mean a disadvantage as to the monitoring process since, in the free-running phase, all switching elements are open insofar as no drive of the motor takes place. If a fault condition occurs during the free-running phase, then this is detected at the next scanning time point when the switching elements 20 and 22 or 16 and 18 are again closed or after a filter time has run. In the event that the motor is not activated, fault conditions are recognized after the filter time has run even when the switch elements 20/22, 16/18 are not closed.

The monitoring procedure provided by the invention permits the detection of the following fault conditions. In the non-driven operating phase A, a short circuit of the terminal points 12 or 14 to the positive pole of the supply voltage is determined when the potential of the terminal point 12 or 14 exceeds the limit value S1. If the potential of one of these terminal points drops below the limit value S2, then a short circuit is present at the terminal point 12 and/or 14 with respect to the negative pole of the supply voltage. If the potential of the terminal point 12 drops below the limit value S2 and, at the same time, the potential of the terminal point 14 exceeds the limit value S1, then the conclusion can be drawn that there is an interruption in the motor loop.

In the case of the drive phase B, a drop below the limit value S3 by the potential of the terminal point 12 results in a short circuit of the terminal point 12 with respect to the negative pole of the supply voltage; whereas, if the potential of the terminal point 14 exceeds the limit value S4, then the conclusion can be drawn that a short circuit of the terminal point 14 with respect to the positive pole of the supply voltage is present. If the potential of the terminal point 12 drops below the limit value S3 and, simultaneously, the potential of the terminal point 14 exceeds the limit value S4, then the conclusion can be drawn that a motor short circuit or a short circuit between the two motor lines is present.

Opposite relationships exist in the other mode of operation.

It is herein understood that short circuits in the context of this disclosure also include shunts which act in a manner similar to short circuits.

Figure 3:
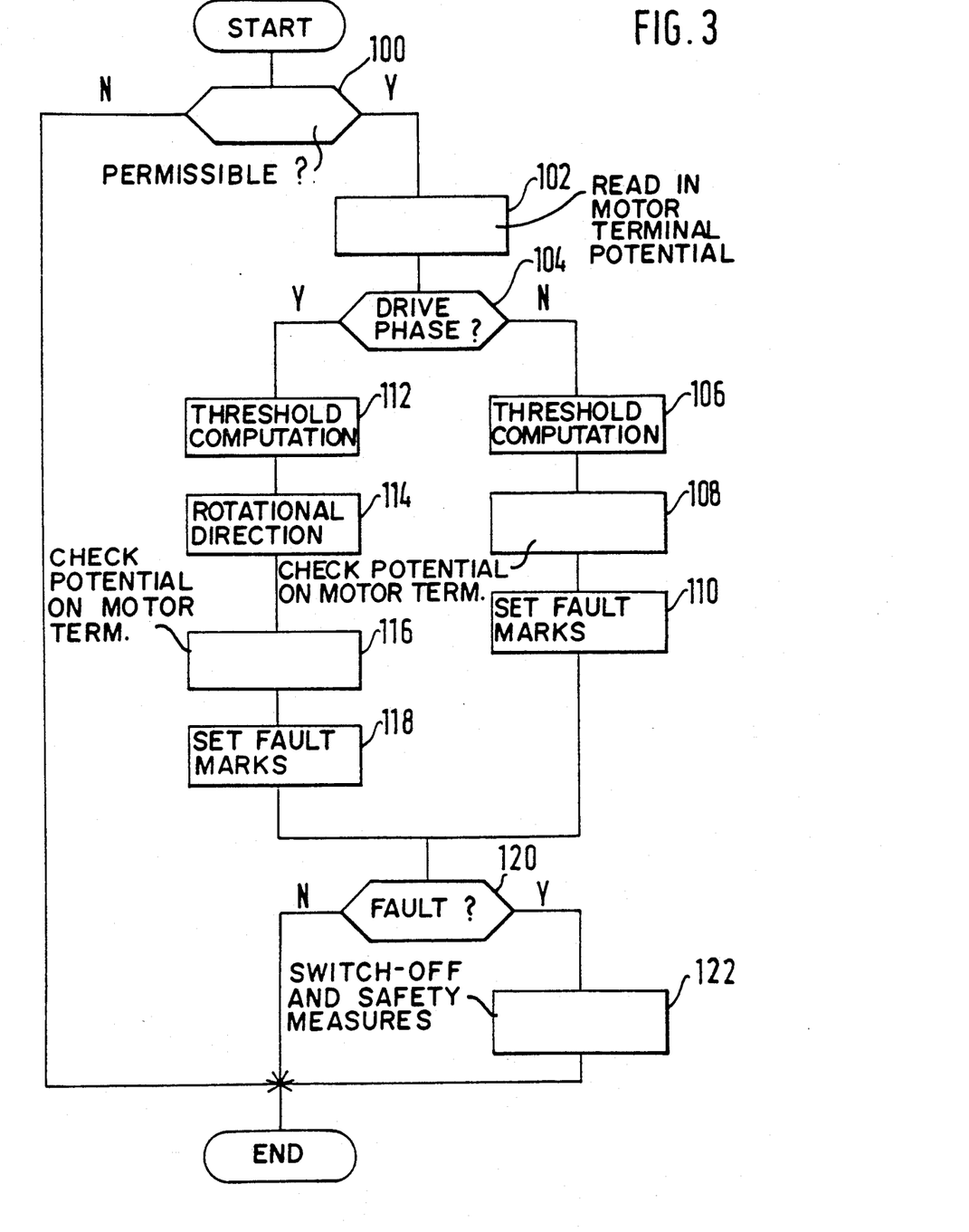

FIG. 3 shows a flowchart as exemplary of a realization of the invention as a program in the computation and storage unit 86.

After the subprogram is started, a check is made in a first step 100 as to whether the subsequent monitoring is permissible. This step is intended to exclude the above-mentioned electric free-running phase during the drive phase B. This is undertaken by means of a check of the pulse length of the drive signal which is stored in the memory cell and which is formed in the computation and storage unit. This step is made to determine whether the end of the actual pulse takes place during the running time of the program. If the monitoring is not permissible, then the subprogram is ended. The monitoring is not permissible when the system is in the drive phase B and, at the same time, all switching elements are open or are opened during the run of the program.

If in step 100 the permissibility of the monitoring is recognized, then the voltage potentials of the terminal points 12 and 14 of the motor 10 are read in via lines 52 and 56 in step 102. In addition, in a preferred embodiment of the invention, the supply voltage detected by the measuring unit 76 is read in. However, this supply voltage can be stored in another embodiment as a fixed value in the computation and storage unit 86. Thereafter, in step 104, an inquiry is made as to whether the system is in the driven phase B or in the non-driven phase A. This can be determined with a mark set in the computation and storage unit 86.

If the system is in the non-driven phase A, then in step 106, the limit values S1 and S2 are computed on the basis of the supply voltage value and, in the following step 108, the read-in potentials of the terminal points 12 and 14 are compared to the two limit values S1 and S2. In the following step 110, fault marks are set when limit values are exceeded or when there is a drop below the limit values. Various fault marks can then be set in correspondence to the evaluated signal values for diagnostic purposes so that a determination of the type of fault condition is possible. If it is ascertained in the inquiry step 104 that the system is in the driven phase B, then the limit values S3 and S4 are computed in step 112 in dependence upon the supply voltage. Thereupon, in step 114, the rotational direction of the motor is determined from marks stored in the computation and storage unit. The rotational direction is set by the computation and storage unit in correspondence to the input variables. In step 116, the read-in voltage potentials of the terminal points 12 and 14 are compared to the computed thresholds S3 and S4 while considering the rotational direction determined in step 114 and, in step 118, fault marks are set in the same manner as in step 110. As mentioned above, these fault marks each represent various fault conditions in accordance with comparison results.

After running through the steps 106 to 110 for the non-driven phase or the steps 112 to 118 in the case of the driven phase, a check is made in inquiry step 120 as to whether a fault condition is present. If this is not the case, then the subprogram is ended and restarted at the next scanning time point.

Safety measures and switchoff measures are initiated in step 122 if it is determined in step 120 that a fault condition is present. These measures can include: a switchoff of the drive in both rotational directions in dependence upon the embodiment, a switchoff of the drive only in one rotational direction, a limitation of the drive, etcetera.

In conclusion, the procedure provided by the invention makes possible a monitoring of an electric consumer without great complexity as to components. Fault recognition means evaluate the result of comparisons of the potentials of terminal points of the consumer to pregiven limit values in accordance with the operating condition of the electric consumer.

The monitoring of an electric consumer according to the invention is explained in the context of an electric motor. It is advantageous to apply the monitoring according to the invention in combination with all two-pole electric consumers which can be switched off so that two-pole switchoff possibilities are provided also for injection valves or ABS valves.

It is understood that the foregoing description is that of the preferred embodiments of the invention and that various changes and modifications may be made thereto without departing from the spirit and scope of the invention as defined in the appended claims.

What is claimed is:

1. An arrangement for fault monitoring an electric consumer in a motor vehicle, the electric consumer having a first phase of operation wherein the consumer is not driven and a second phase of operation wherein the consumer is driven, the arrangement comprising:

first and second terminals connected to said consumer;

two transmitting lines connected to corresponding ones of said terminals;

first drive means for driving said consumer via said transmitting lines;

second drive means for driving said consumer via said terminals;

computer and storage means for generating a pulse-shaped control signal for said first drive means and said second drive means;

voltage supply means for supplying a voltage to the consumer at said first and second terminals thereof whereby first and second potentials having potential values are present at said terminals, respectively, which shift when a fault is present and said voltage supply means including a pole defining a polarity thereof;

detection means for detecting first and second potential values at said first and second terminals in both said non-driven phase and said drive phase thereof, respectively;

means for supplying said detected potential values to said computer and storage means;

said computer and storage means being adapted to form an upper limit value and a lower limit value when said consumer is in said driven phase and being further adapted to compare the detected potential values to said limit values to detect a possible fault; and, said computer and storage means also being adapted to detect a short circuit to said pole when said first potential value drops below said upper limit value and said second potential value exceeds said lower limit value and, said computer and storage means being further adapted to detect a short circuit or a shunt between said transmitting lines when said potential value at said first terminal drops below said upper limit value while at the same time, the potential value at said second terminal exceeds said lower limit value.

2. An arrangement for fault monitoring an electric consumer in a motor vehicle, the electric consumer having a first phase of operation wherein the consumer is not driven and a second phase of operation wherein the consumer is driven, the arrangement comprising:

voltage supply means for supplying voltage to the consumer whereby potentials having potential values are present in the region of the consumer wherein the potentials shift when a fault is present;

drive means for actuating the electric consumer thereby defining the driven phase of said consumer;

computer and storage means for generating a pulse-shaped control signal for said drive means;

voltage detection means for detecting the potential values in the region of said consumer in both said non-driven phase and said driven phase thereof;

means for transmitting the detected potential values to said computer and storage means during both of said phases; and, said computer and storage means being adapted to form a first limit value when said consumer is in the non-driven phase and a second limit value when said consumer is in the driven phase and being further adapted to compare the detected potential values to corresponding one of said limit values in dependence upon the phase of operation of said consumer thereby enabling a fault to be detecting also in said non-driven phase because of said shift in said potential values.

3. The arrangement of claim 2, wherein said arrangement includes supply voltage means for providing a supply voltage for he electric consumer; and wherein said limit values are pregiven in dependence upon said supply voltage.

4. The arrangement of claim 2, wherein the electric consumer is an electric motor for controlling a power-determining element of a motor vehicle; and, wherein the electric motor can be switched off in a two-pole manner.

5. The arrangement of claim 2, wherein said limit values are selected in dependence upon the direction of rotation of the electric consumer.

6. The arrangement of claim 2, wherein said detection means includes a switching unit for detecting said potential values at said terminal points; and, said switching unit including a switching element and resistance circuit means connected to said switching element.

7. The arrangement of claim 2, wherein said detection means includes first means for detecting a fault condition corresponding to short circuit for the non-driven phase of said consumer when the potentials of said terminal points exceed the upper or lower limit values; second means for detecting a fault condition corresponding to an interruption when said potentials simultaneously exceed said upper and lower limit values; third means for detecting a fault condition corresponding to a short circuit for the driven phase of said consumer when said potentials individually drop below the upper or lower limit values; and, fourth means for detecting a fault condition corresponding to a short circuit in the electric consumer when said potentials simultaneously drop below said upper limit values and exceed said lower limit values.

8. The arrangement of claim 2, wherein no monitoring takes place in an electric free-running state.

9. The arrangement of claim 2, wherein fault marks are set in dependence upon the recognized fault condition.

10. The arrangement of claim 2, wherein emergency or switch-off measures are initiated when a fault is recognized.

* * * * *

UNITED STATES PATENT AND TRADEMARK OFFICE
CERTIFICATE OF CORRECTION

PATENT NO. : 5,329,238
DATED : July 12, 1994
INVENTOR(S) : Michael Hofsäss, Martin Rutz and Harald Schweren It is certified that error appears in the above-identified patent and that said Letters Patent is hereby corrected as shown below:

In column 3, line 6: delete "add" and substitute -- and -- therefor.

In column 3, line 8: delete "Il" and substitute -- In -- therefor.

In column 8, line 21: delete "drive" and substitute -- driven -- therefor.

In column 8, line 67: delete "one" and substitute -- ones -- therefor.

In column 9, line 1: delete "detecting" and substitute -- detected -- therefor.

In column 9, line 6: delete "he" and substitute -- the -- therefor.

Signed and Sealed this

Fifteenth Day of November, 1994

Attest:

BRUCE LEHMAN

*Attesting Officer*    *Commissioner of Patents and Trademarks*